United States Patent
Murakami

(10) Patent No.: US 8,994,454 B2
(45) Date of Patent: Mar. 31, 2015

(54) AMPLIFIER CIRCUIT

(75) Inventor: Tadamasa Murakami, Yokohama (JP)

(73) Assignee: Samsung Electro-Mechanics Co., Ltd., Suwon-Si (KR)

( * ) Notice: Subject to any disclaimer, the term of this patent is extended or adjusted under 35 U.S.C. 154(b) by 101 days.

(21) Appl. No.: 13/612,233

(22) Filed: Sep. 12, 2012

(65) Prior Publication Data

US 2013/0127544 A1 May 23, 2013

(30) Foreign Application Priority Data

Nov. 22, 2011 (JP) ................... 2011-255207

(51) Int. Cl.
*H02H 7/20* (2006.01)
*H03F 1/02* (2006.01)
*H03F 1/22* (2006.01)
*H03F 1/52* (2006.01)
*H03F 1/56* (2006.01)
*H03F 3/189* (2006.01)

(52) U.S. Cl.
CPC ................. *H03F 1/02* (2013.01); *H03F 1/223* (2013.01); *H03F 1/523* (2013.01); *H03F 1/56* (2013.01); *H03F 3/189* (2013.01); *H03F 2200/108* (2013.01); *H03F 2200/18* (2013.01); *H03F 2200/294* (2013.01); *H03F 2200/444* (2013.01); *H03F 2200/492* (2013.01)
USPC ........................ 330/298; 330/277; 330/207 P

(58) Field of Classification Search
CPC .................................... H03F 1/52; H03H 7/20
USPC ................ 330/277, 298, 207 P; 327/325, 309
See application file for complete search history.

(56) References Cited

U.S. PATENT DOCUMENTS

| 5,528,189 | A | 6/1996 | Khatibzadeh | |
|---|---|---|---|---|
| 7,663,851 | B2 * | 2/2010 | Huang et al. | .................... 361/56 |
| 2003/0151865 | A1 | 8/2003 | Maio | |
| 2006/0268474 | A1 | 11/2006 | Huang et al. | |
| 2010/0295614 | A1 * | 11/2010 | Fujita et al. | ................ 330/207 P |

FOREIGN PATENT DOCUMENTS

| JP | 03-019507 A | 1/1991 |
|---|---|---|
| JP | 11-312930 A | 11/1999 |
| JP | 2003-242512 A | 8/2003 |

OTHER PUBLICATIONS

Japanese Office Action issued in Japanese Patent Application No. 2011-255207 mailed Jan. 14, 2014, with English translation, 7 pgs.

(Continued)

*Primary Examiner* — Robert Pascal
*Assistant Examiner* — Khiem Nguyen
(74) *Attorney, Agent, or Firm* — McDermott Will & Emery LLP

(57) ABSTRACT

According to embodiments of the present invention, an over-input signal may be limited to be within a range between adjustable upper limit voltage and lower limit voltage while suppressing deterioration of a noise figure. An amplifier circuit includes an input transistor; an input transistor; a resistor element having a first terminal connected to a gate of the input transistor and a second terminal connected to a bias voltage; and a protective circuit connected to the gate of the input transistor and limiting an input to the gate of the input transistor to be within a range between an upper limit voltage and lower limit voltage adjustable based on the bias voltage.

2 Claims, 12 Drawing Sheets

(56) References Cited

OTHER PUBLICATIONS

Korean Office Action issued in Korean Application No. 10-2012-0032422 dated Jul. 7, 2014, w/English abstract.

* cited by examiner

AMPLIFIER CIRCUIT

CROSS-REFERENCE TO RELATED APPLICATIONS

This application claims the priority of Japanese Patent Application No. 2011-255207 filed on Nov. 22, 2011, in the Japan Patent Office, the disclosure of which is incorporated herein by reference.

BACKGROUND OF THE INVENTION

1. Field of the Invention

The present invention relates to an amplifier circuit.

2. Description of the Related Art

In wireless communications systems such as mobile phones or wireless data communications devices, an amplifier circuit for amplifying a received signal is provided on a receiving side. An example of an amplifier circuit may include, for example, a low noise amplifier (LNA). An LNA is an amplifier circuit that amplifies a signal by reducing noise generated in the circuit by as much as possible and is an essential circuit disposed at a front end of a wireless receiving circuit.

As described above, as demand for inexpensive LNAs has increased, LNAs have been formed of a complementary metal oxide semiconductor (CMOS).

In addition, since the case in which a transmitter is adjacent to a receiver may exist, an over-input signal, input to the LNA, may be generated. However, a gate oxide film of an input transistor in the LNA may be deteriorated or damaged by the over-input signal. Therefore, it is important to address the issue of the over-input signal. An example of an over-input signal counter-measure may include a method of using a MOS transistor with high pressure resistance in an input of the LNA. In addition, Patent Document 1 discloses a protective circuit for increasing resistance against a surge voltage with a complementary diode formed by reversely connecting diode-connected MOS transistors in parallel.

However, the method of using the MOS transistor with the high pressure resistance at the input of the LNA may increase a gate length and an oxide film thickness of the MOS transistor. For this reason, a cutoff frequency of the MOS transistor may be deteriorated and as a result, a noise figure (NF), an important characteristic of the LNA, may be deteriorated. In addition, in the protective circuit disclosed in Patent Document 1, one end of the complementary diode is connected to a ground (GND) and a function of adjusting an upper limit voltage or a lower limit voltage of the input is not furnished.

RELATED ART DOCUMENT

[Patent Document 1] Japanese Patent Laid-Open Publication No. 2003-243512

SUMMARY OF THE INVENTION

An aspect of the present invention provides a new and improved amplifier circuit capable of limiting an over-input signal to be within a range between an adjustable upper limit voltage and a lower limit voltage, while suppressing deterioration of a noise figure.

According to an aspect of the present invention, there is provided an amplifier circuit including: an input transistor; a resistor element having a first terminal connected to a gate of the input transistor and a second terminal connected to a bias voltage; and a protective circuit connected to the gate of the input transistor and limiting an input to the gate of the input transistor to be within a range between an upper limit voltage and lower limit voltage adjustable based on the bias voltage. According to the above configuration, the input transistor may be appropriately protected from an over-input signal by adjusting the upper limit voltage and the lower limit voltage.

The protective circuit may include a first MOS transistor that is diode-connected; and a second MOS transistor disposed in parallel with the first MOS transistor and diode-connected in a reverse direction with respect to the first MOS transistor. According to the above configuration, when the input is greater than the upper limit voltage, voltage is conducted through the first MOS transistor or the second MOS transistor and therefore, the input may be limited to be within a range between the upper limit voltage and the lower limit voltage.

A source of the first MOS transistor and a drain of the second MOS transistor may be connected to a variable bias voltage. According to the above configuration, a threshold voltage of the first MOS transistor and the second MOS transistor may be changed according to a change in the variable bias voltage and therefore, the upper limit voltage and the lower limit voltage depending on the threshold voltage of the first MOS transistor and the second MOS transistor may be appropriately adjusted.

The source of the first MOS transistor and the drain of the second MOS transistor may be connected to the bias voltage and a body terminal of the first MOS transistor and a body terminal of the second MOS transistor may be connected to the variable bias voltage. According to the above configuration, the threshold voltage of the first MOS transistor and the second MOS transistor may be changed according to a change in the variable bias voltage and therefore, the upper limit voltage and the lower limit voltage depending on the threshold voltage of the first MOS transistor and the second MOS transistor may be appropriately adjusted.

The protective circuit may further include: a first MOS transistor group including a plurality of MOS transistors disposed in series, respective MOS transistors being diode-connected in the same direction; a second MOS transistor group disposed in parallel with the first MOS transistor group and including a plurality of MOS transistors disposed in series, respective MOS transistors being diode-connected in a reverse direction with respect to the respective MOS transistors included in the first MOS transistor group; and a connection control unit controlling a short-circuit of sources and drains of the respective MOS transistors included in the first MOS transistor group and the second MOS transistor group. According to the above configuration, the upper limit voltage and the lower limit voltage may be adjusted by controlling short-circuits of the sources and the drains of respective MOS transistors included in the first MOS transistor group and the second MOS transistor group and therefore, the input transistor may be appropriately protected from the over-input signal.

The protective circuit may further include: a first source follower circuit including a third transistor having a drain connected to a predetermined voltage; and a second source follower circuit including a fourth transistor having a drain connected to the predetermined voltage, wherein the drain of the third MOS transistor is connected to a gate of the first MOS transistor, the drain of the fourth MOS transistor connected to a gate of the second MOS transistor, and the third MOS transistor and the fourth MOS transistor has gates connected to a variable bias voltage. According to the above configuration, the upper voltage limit and the lower limit voltage may be adjusted by the variable bias voltage connected to the first source follower circuit and the second source follower circuit and therefore, the input transistor may be appropriately protected from the over-input signal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
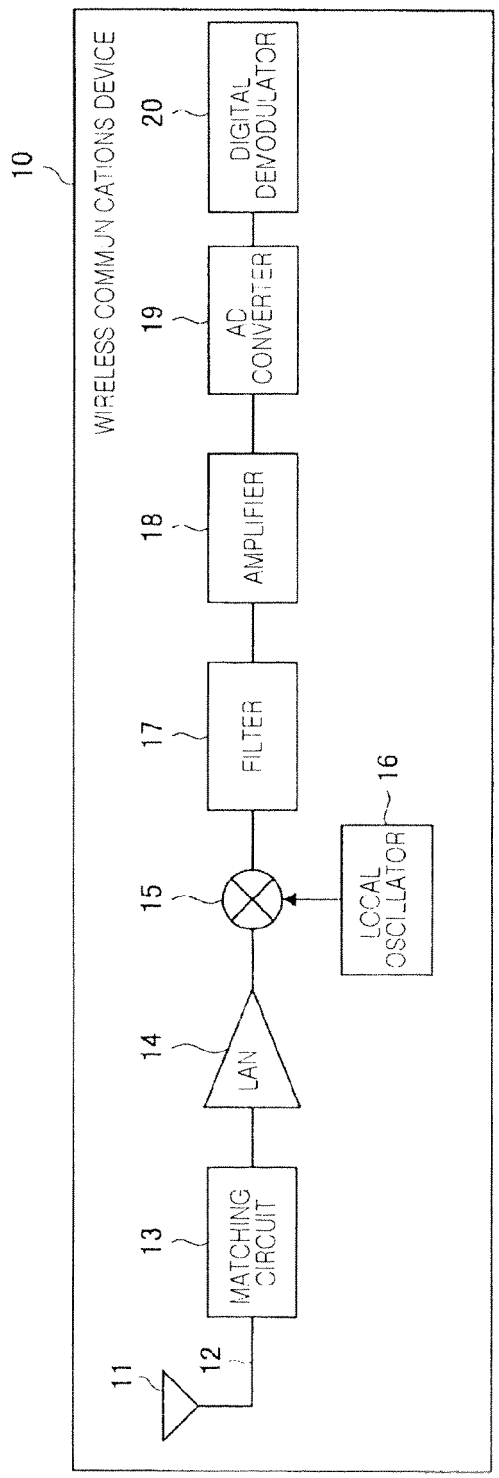
FIG. 1 is a diagram illustrating a configuration example of a wireless communications device according to an embodiment of the present invention.

Hereinafter, embodiments of the present invention will be described in detail with reference to the accompanying drawings. Meanwhile, like components having substantially the same functional constitution in the specification and drawings of the present invention are denoted by like reference numerals and the description thereof will be omitted herein.

In addition, embodiments of the present invention relate to a low noise amplifier (LNA) that is used for a receiving circuit of a wireless communications device. Hereinafter, a configuration of a receiving circuit of a wireless communications device is described and then, a first embodiment to a fifth embodiment of the LNA will be sequentially described in detail.

1. CONFIGURATION EXAMPLE OF WIRELESS COMMUNICATIONS Device

FIG. 1 is a diagram illustrating a configuration example of a wireless communications device 10 according to an embodiment of the present invention. As shown in FIG. 1, the wireless communications device 10 according to an embodiment of the present invention may include an antenna 11, a transmission line 12, an impedance matching circuit 13, an LNA 14, a mixer 15, a local oscillator 16, a filter 17, an amplifier 18, an AD converter 19, and a digital demodulator 20.

The antenna 11 is provided to transmit and receive a radio wave. In the present embodiment, the wireless communications device 10 transmits and receives a high frequency signal in a GHz band, in particular, a high frequency signal in a 5 GHz band. The high frequency signal received by the antenna 11 is transmitted to the impedance matching circuit 13 through the transmission line 12.

The impedance matching circuit 13 is a circuit for performing impedance matching in which reflection of the high frequency signal to the transmission line 12 is minimal. The high frequency signal received by the antenna 11 is transmitted to the impedance matching circuit 13 through the transmission line 12, and then transmitted to the LNA 14.

The LNA 14 amplifies the high frequency signal transmitted from the impedance matching circuit 13. As described above, the LNA 11 is an amplifier circuit for amplifying a signal by reducing noise generated in the circuit by as much as possible. In addition, in the present embodiment, the LNA 14 may be implemented as CMOS. The high frequency signal amplified by the LNA 14 is transmitted to the mixer 15.

The mixer 15 multiplies a high frequency signal output from the local oscillator 16 by the high frequency signal amplified by the LNA 14. The mixer 15 multiplies the high frequency signal output from the local oscillator 16 by the high frequency signal amplified by the LNA 14, such that the high frequency signal in a GHz band is converted into the signal in a MHz band. The mixer 15 outputs the signal in a MHz band to the filter 17.

The local oscillator 16 outputs a high frequency signal having a predetermined frequency. The high frequency signal output from the local oscillator 16 is transmitted to the mixer 15. As described above, the mixer 15 multiplies the high frequency signal output from the local oscillator 16 by the high frequency signal amplified by the LNA 14, such that the high frequency signal in a GHz band is converted into the signal in a MHz band.

The filter 17 only allows a single having a predetermined frequency among the signals output from the mixer 15 to pass therethrough. The signal passing through the filter 17 is transmitted to the amplifier 18. The amplifier 18 amplifies the signal passing through the filter 17. The signal amplified by the amplifier 18 is transmitted to the AD converter 19.

The AD converter 19 converts the signal in an analog form transmitted from the amplifier 18 into a digital signal. The digital signal converted by the AD converter 19 is transmitted to a digital demodulator 20. The digital demodulator 20 demodulates the digital signal converted by the AD converter 19. The digital demodulator 20 demodulates the digital signal, such that the contents of the received high frequency signal may be understood by the wireless communications device 10.

(Background)

The configuration example of the wireless communications device 10 according to the embodiment of the present invention was described with reference to FIG. 1. As described above, since the wireless communications device may be disposed to be adjacent to the transmitter, the over-input signal, input to the LNA, may occur. However, a gate oxide film of an input transistor in the LNA may be deteriorated or damaged by the over-input signal. Therefore, it is important to address the issue of the over-input signal.

An example of the over-input signal countermeasure may include a method of using a MOS transistor with high pressure resistance in an input to the LNA. However, the method of using the MOS transistor with the high pressure resistance in the input to the LNA may cause an increase in a gate length and an oxide film thickness of the MOS transistor. For this reason, a cutoff frequency of the MOS transistor may be deteriorated and as a result, a noise figure (NF), an important characteristic of the LNA, may be deteriorated.

In addition, a method for increasing resistance against a surge voltage by disposing a protective circuit in front of the input transistor of the LNA has been proposed. Hereinafter, this will be described in more detail with reference to FIG. 2.

Figure 2:
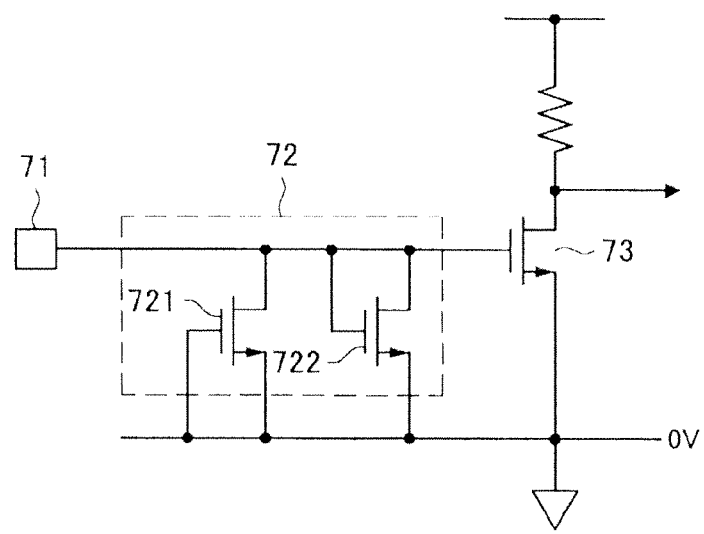
FIG. 2 is a diagram illustrating a configuration of a low noise amplifier (LNA) according to a comparative example.

FIG. 2 is a diagram illustrating a configuration of an LNA according to a comparative example. As shown in FIG. 2, the LNA according to the comparative example may include an input terminal 71, an input transistor 73 having a source connected to a ground voltage and a drain connected to a power supply voltage, and a protective circuit 72 formed of diode-connected NMOS transistors 721 and 722. In this configuration, the NMOS transistors 721 and 722 are complementary diodes connected in parallel in reverse directions and each NMOS transistor has one terminal connected to the ground voltage and the other terminal connected to the input terminal 71 and a gate of the input transistor 73.

In the LNA according to the comparative example as described above, when a positive surge voltage is input to the input terminal 71, the voltage is conducted through the NMOS transistor 721, while when a negative surge voltage is input to the input terminal 71, the voltage is conducted through the NMOS transistor 722. For this reason, it is possible to protect the input transistor 73 while suppressing the voltage applied to the gate of the input transistor 73.

However, the protective circuit 72 of the LNA according to the foregoing comparative example may not address the issue of the over-input signal and has no control function of limiting the input.

Therefore, the present embodiment is devised in consideration of the foregoing situations. The LNA 14 according to respective embodiments of the present invention may be protected from the over-input signal while suppressing the deterioration of the noise figure. In addition, according to second to fifth embodiments of the present invention, it is possible to more appropriately protect the amplifier circuit by adjusting the upper limit voltage and the lower limit voltage that limits the level of the input signal. As described above, respective embodiments of the present invention will be sequentially described below in detail.

2. FIRST EMBODIMENT

Configuration of LNA According to First Embodiment

Figure 3:
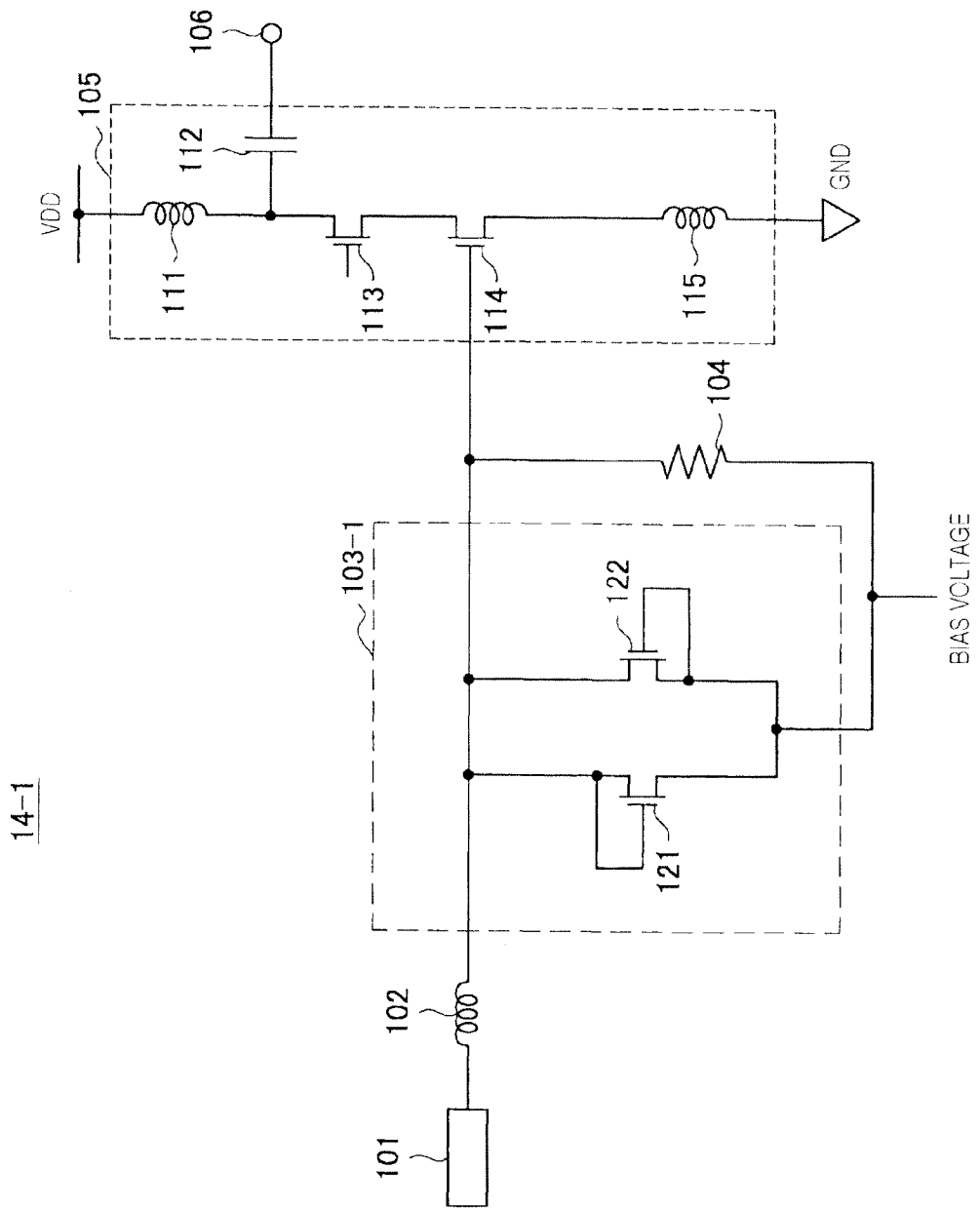
FIG. 3 is a diagram illustrating a circuit configuration of an LNA according to a first embodiment of the present invention.

FIG. 3 is a diagram illustrating a circuit configuration of an LNA 14-1 according to a first embodiment of the present invention. As shown in FIG. 3, the LNA 14-1 according to the first embodiment of the present invention may include an input terminal 101, an inductor 102, a protective circuit 103-1, a resistor element 104, an amplifier circuit 105, and an output terminal 106.

The amplifier circuit 105 may include an inductor 111, a capacitor 112, an MOS transistor 113, an input transistor 114, and an inductor 115. In addition, the protective circuit 103-1 may include an MOS transistor 121 and an MOS transistor 122.

The input terminal 101 is a terminal at which the high frequency signal transmitted from the impedance matching circuit 13 arrives. The input terminal 101 is connected to a gate of the input transistor 114 included in the amplifier circuit 105 through the inductor 102.

The amplifier circuit 105 amplifies the high frequency signal received by the input terminal 101 and outputs the amplified high frequency signal to the output terminal 106. As shown in FIG. 2, the input transistor 114 has a drain connected to a power supply voltage VDD through the MOS transistor 113 and the inductor 111, a gate connected to the input terminal 101, and a source connected to one terminal of the inductor 115. Meanwhile, the MOS transistor 113 is a switch for intercepting a connection between the power supply voltage VDD and the input transistor 114, when the LNA 14-1 is not required to be operated, for example, when the receiving is not performed, and the like.

The protective circuit 103-1 is a circuit for preventing a large signal from being input to the amplifier circuit 105 and may be disposed in parallel with the resistor element 104 between the amplifier circuit 105 and the inductor 102.

In addition, the MOS transistor 121 and the MOS transistor 122 configuring the protective circuit 103-1 are disposed in parallel and diode-connected in reverse directions. In detail, a drain and a gate of the MOS transistor 121 are connected to the gate of the input transistor 114 and a source thereof is connected to a bias voltage. Meanwhile, in the MOS transistor 122 disposed in a reverse direction with respect to the MOS transistor 121, a source of the MOS transistor 122 is connected to the gate of the input transistor 114 and a drain and a gate thereof are connected to the bias voltage.

(Operation of LNA According to First Embodiment)

The configuration of the LNA 14-1 according to the first embodiment of the present invention is described above. Next, the operation of the LNA 14-1 according to the first embodiment of the present invention will be described.

When a signal greater than the upper limit voltage (bias voltage+threshold voltage Vth of the MOS transistor 121) is input to the input terminal 101, the voltage is conducted through the MOS transistor 121 and therefore, a signal value is limited to the upper limit voltage. Similarly, when a signal lower than the lower limit voltage (bias voltage−threshold voltage Vth of the MOS transistor 122) is input to the input terminal 101, the voltage is conducted through the MOS transistor 122 and therefore, the signal value is limited to the lower limit voltage.

Figure 4:
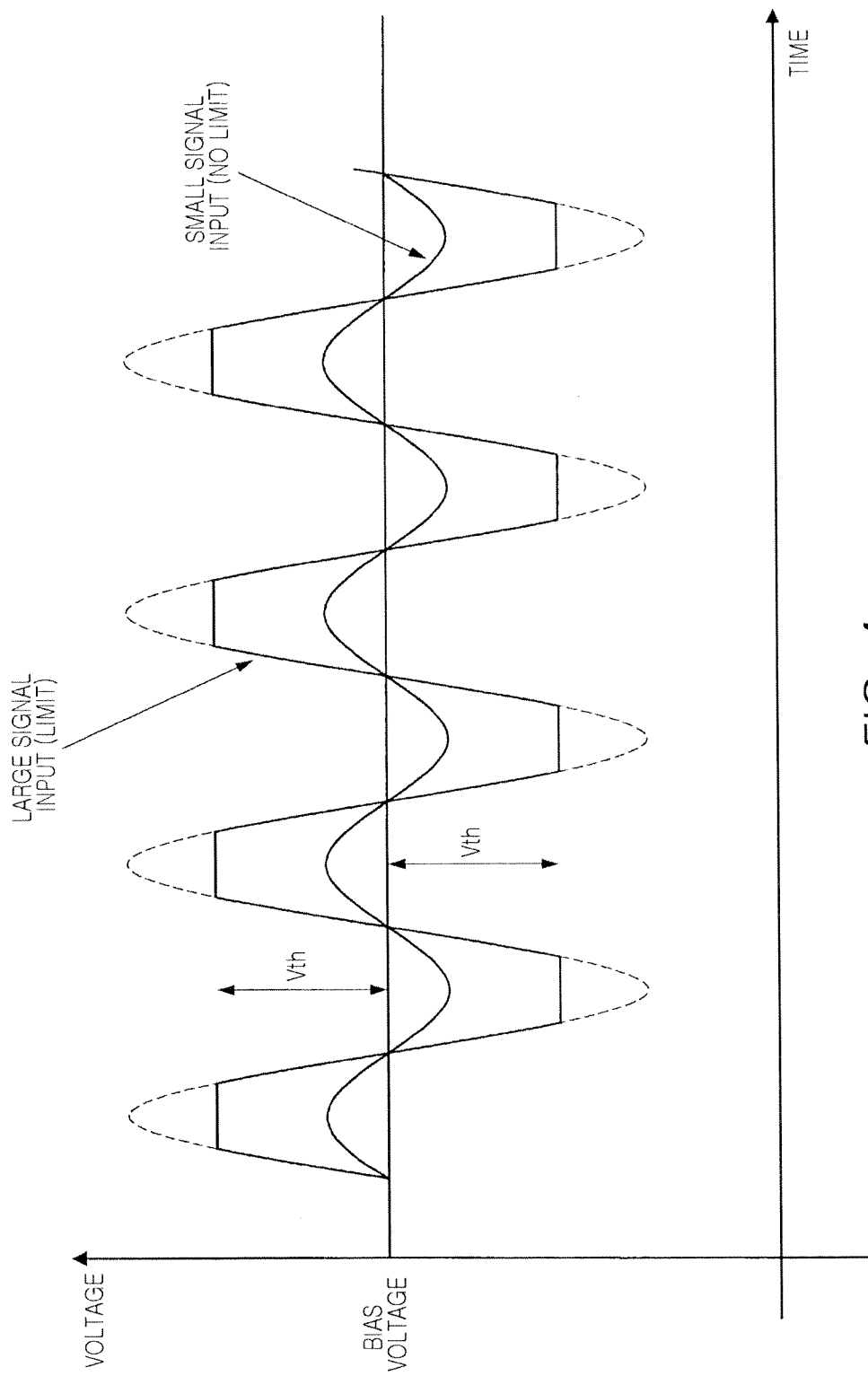
FIG. 4 is a diagram illustrating an operation of the LNA according to the first embodiment of the present invention.

For this reason, as shown in FIG. 4, in the case that a signal having a low amplitude is input, the MOS transistors 121 and 122 are not operated and therefore, the input signal is input to the amplifier circuit 105 as is. Meanwhile, in the case that a signal having a high amplitude is input, a limit is applied by the upper limit voltage higher than the bias voltage by an amount equal to the threshold voltage Vth and the lower limit voltage lower than the bias voltage by an amount equal to the threshold voltage Vth, such that the amplitude of voltage input to the amplifier circuit 105 is limited.

(Effect of First Embodiment)

As described above, according to the first embodiment of the present invention, it is possible to protect the input transistor 114 from the over-input signal based on the bias voltage by a simple protective circuit 103-1 using the MOS diode.

3. SECOND EMBODIMENT

Configuration of LNA According to Second Embodiment

Figure 5:
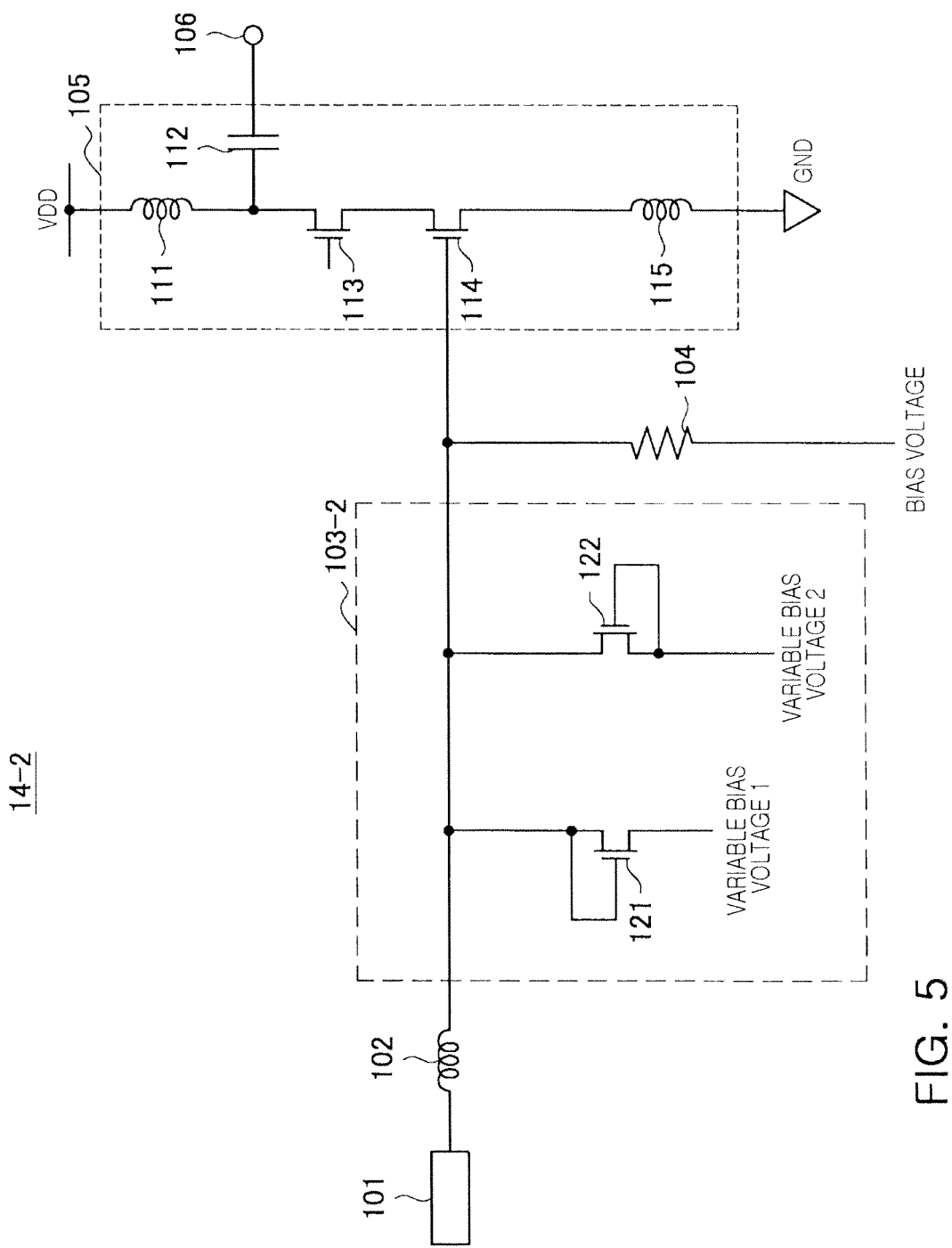
FIG. 5 is a diagram illustrating a circuit configuration of an LNA according to a second embodiment of the present invention.

FIG. 5 is a diagram illustrating a circuit configuration of an LNA 14-2 according to a second embodiment of the present invention. As shown in FIG. 5, the LNA 14-2 according to the second embodiment of the present invention includes the input terminal 101, the inductor 102, a protective circuit 103-2, the resistor element 104, the amplifier circuit 105, and the output terminal 106. The components other than the protective circuit 103-2 are the same as the first embodiment of the present invention and therefore, a detailed description thereof will be omitted herein.

Similar to the protective circuit 103-1 according to the first embodiment of the present invention, the protective circuit 103-2 is a circuit for preventing a large signal from being input to the amplifier circuit 105 and is disposed in parallel with the resistor element 104 between the amplifier circuit 105 and the inductor 102.

In addition, the protective circuit 103-2 includes the MOS transistor 121 and the MOS transistor 122 that are disposed in parallel and are diode-connected in reverse directions. In detail, the drain and the gate of the MOS transistor 121 are connected to the gate of the input transistor 114 and the source of the MOS transistor 122 is connected to the gate of the input transistor 114.

Here, unlike the first embodiment of the present invention, the MOS transistor 121 and the MOS transistor 122 each have one end connected to a variable bias voltage. For example, as shown in FIG. 5, variable bias voltage 1 is connected to the source of the MOS transistor 121 and variable bias voltage 2 is connected to the drain and the gate of the MOS transistor 121.

(Operation of LNA According to Second Embodiment)

The configuration of the LNA 14-2 according to the second embodiment of the present invention is described above. Next, the operation of the LNA 14-2 according to the second embodiment of the present invention will be described.

When a signal greater than the upper limit voltage (variable bias voltage 1+threshold voltage Vth of the MOS transistor 121) is input to the input terminal 101, the voltage is conducted through the MOS transistor 121 and therefore, a signal value is limited to the upper limit voltage. Similarly, when a signal lower than the lower limit voltage (variable bias voltage 2−threshold voltage Vth of the MOS transistor 122) is input to the input terminal 101, the voltage is conducted through the MOS transistor 122 and therefore, the signal value is limited to the lower limit voltage.

Figure 6:
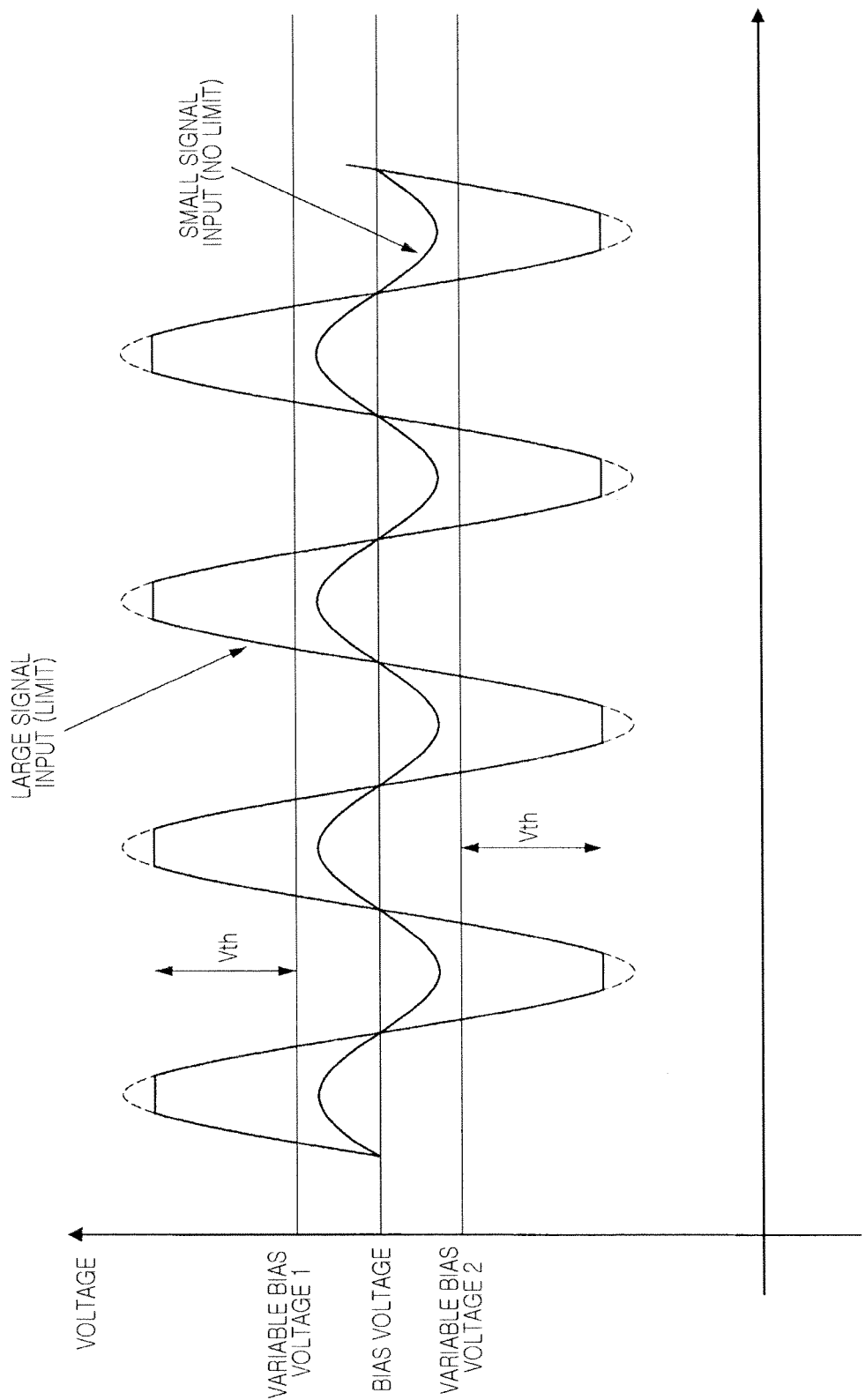
FIG. 6 is a diagram illustrating an operation of the LNA according to the second embodiment of the present invention.

For this reason, as shown in FIG. 6, in the case that a signal having a low amplitude is input, the MOS transistors 121 and 122 are not operated and therefore, the input signal is input to the amplifier circuit 105 as is. Meanwhile, when a signal having a high amplitude is input, a limit is applied by the upper limit voltage higher than the variable bias voltage 1 by an amount equal to the threshold voltage Vth and the lower limit voltage lower than the variable bias voltage 2 by an amount equal to the threshold voltage Vth, such that the amplitude of voltage input to the amplifier circuit 105 is limited.

(Effect of Second Embodiment)

As described above, according to the second embodiment of the present invention, since the MOS transistor 121 and the MOS transistor 122 are connected to the variable bias voltages, it is possible to more appropriately protect the input transistor 114 from the over-input signal by changing the variable bias voltages so as to adjust the upper limit voltage and the lower limit voltage.

4. THIRD EMBODIMENT

Configuration of LNA According to Third Embodiment

Figure 7:
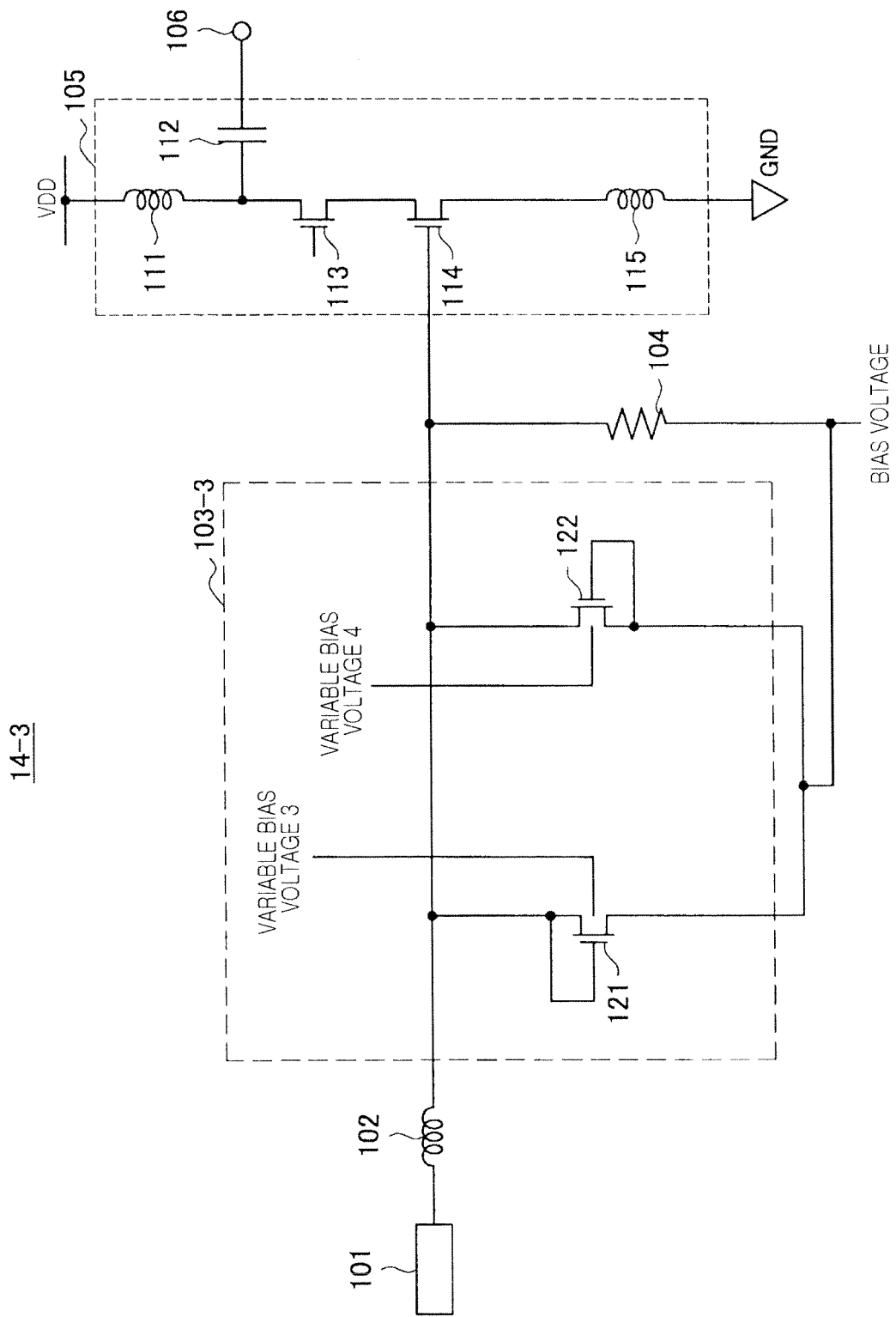
FIG. 7 is a diagram illustrating a circuit configuration of an LNA according to a third embodiment of the present invention.

FIG. 7 is a diagram illustrating a circuit configuration of an LNA 14-3 according to a third embodiment of the present invention. As shown in FIG. 7, the LNA 14-3 according to the third embodiment of the present invention includes the input terminal 101, the inductor 102, a protective circuit 103-3, the resistor element 104, the amplifier circuit 105, and the output terminal 106. Components other than the protective circuit 103-3 are the same as the first embodiment of the present invention and therefore, the detailed description thereof will be omitted herein.

The protective circuit 103-3 is a circuit for preventing a large signal from being input to the amplifier circuit 105 and may be disposed in parallel with the resistor element 104 between the amplifier circuit 105 and the inductor 102.

In addition, the MOS transistor 121 and the MOS transistor 122 configuring the protective circuit 103-3 are disposed in parallel and diode-connected in reverse directions. In detail, the drain and the gate of the MOS transistor 121 are connected to the gate of the input transistor 114 and the source thereof is connected to the bias voltage. Meanwhile, in the MOS transistor 122 disposed in a reverse direction with respect to the MOS transistor 121, the source of the MOS transistor 122 is connected to the gate of the input transistor 114 and the drain and the gate thereof are connected to the bias voltage.

In addition, in the third embodiment of the present invention, variable bias voltages are connected to body terminals of the MOS transistor 121 and the MOS transistor 122. For example, as shown in FIG. 7, a variable bias voltage 3 is connected to the body terminal of the MOS transistor 121 and a variable bias voltage 4 is connected to the body terminal of the MOS transistor 122.

(Operation of LNA According to Third Embodiment)

The configuration of the LNA 14-3 according to the third embodiment of the present invention is described above. Next, the operation of the LNA 14-3 according to the third embodiment of the present invention will be described.

The threshold voltage Vth of the MOS transistor 121 and the MOS transistor 122 is changed by the voltage applied to the body terminals of the MOS transistor 121 and the MOS transistor 122. For this reason, in the third embodiment of the present invention, a value obtained by adding variation $\Delta V1$ of the threshold voltage of the MOS transistor 121 caused by the variable bias voltage 3, an original threshold voltage Vth of the MOS transistor 121, and the bias voltage may be the upper limit voltage. Similarly, a value obtained by subtracting variation $\Delta V2$ of the threshold voltage of the MOS transistor 122 caused by the variable bias voltage 4 and the original threshold voltage Vth of the MOS transistor 121 from the bias voltage may be the lower limit voltage.

When a signal greater than the upper limit voltage (bias voltage+Vth+$\Delta V1$) is input, the voltage is conducted through the MOS transistor 121 and therefore, a signal value is limited to the upper limit voltage. Similarly, when a signal lower than the lower limit voltage (bias voltage−Vth−$\Delta V2$) is input to the input terminal 101, the voltage is conducted through the MOS transistor 122 and therefore, the signal value is limited to the lower limit voltage.

Figure 8:
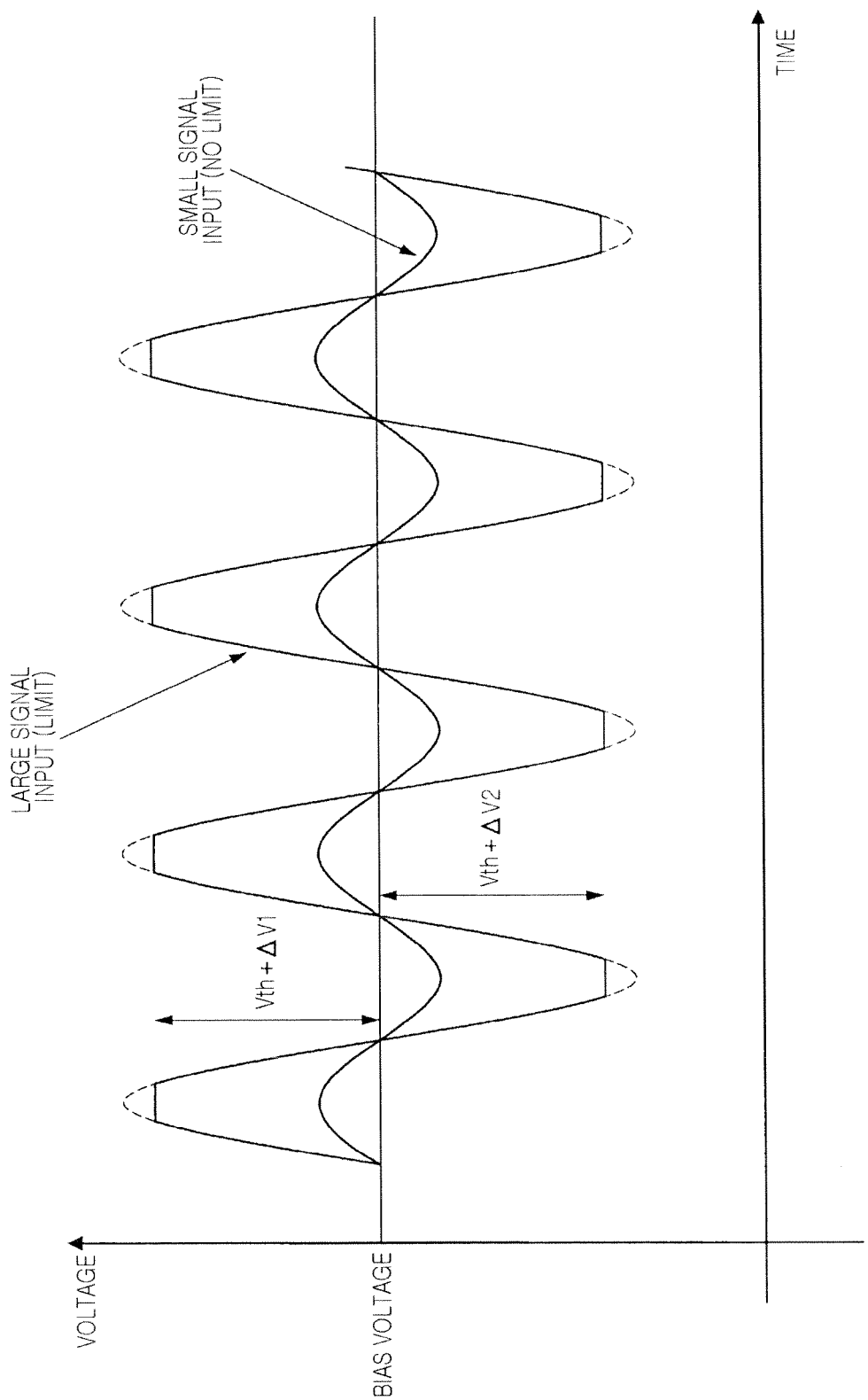
FIG. 8 is a diagram illustrating an operation of the LNA according to the third embodiment of the present invention.

For this reason, as shown in FIG. 8, in the case that a signal having a low amplitude is input, the MOS transistors 121 and 122 are not operated and therefore, the input signal is input to the amplifier circuit 105 as is. Meanwhile, in the case that a signal having a high amplitude is input, a limit is applied by the upper limit voltage and the lower limit voltage, such that the amplitude of voltage input to the amplifier circuit 105 is limited.

(Effect of Third Embodiment)

As described above, according to the third embodiment of the present invention, since the body terminals of the MOS transistor 121 and the MOS transistor 122 are connected to the variable bias voltages, it is possible to more appropriately protect the input transistor 114 from the over-input signal by changing the variable bias voltages so as to adjust the upper limit voltage and the lower limit voltage.

5. FOURTH EMBODIMENT

Configuration of LNA According to Fourth Embodiment

Figure 9:
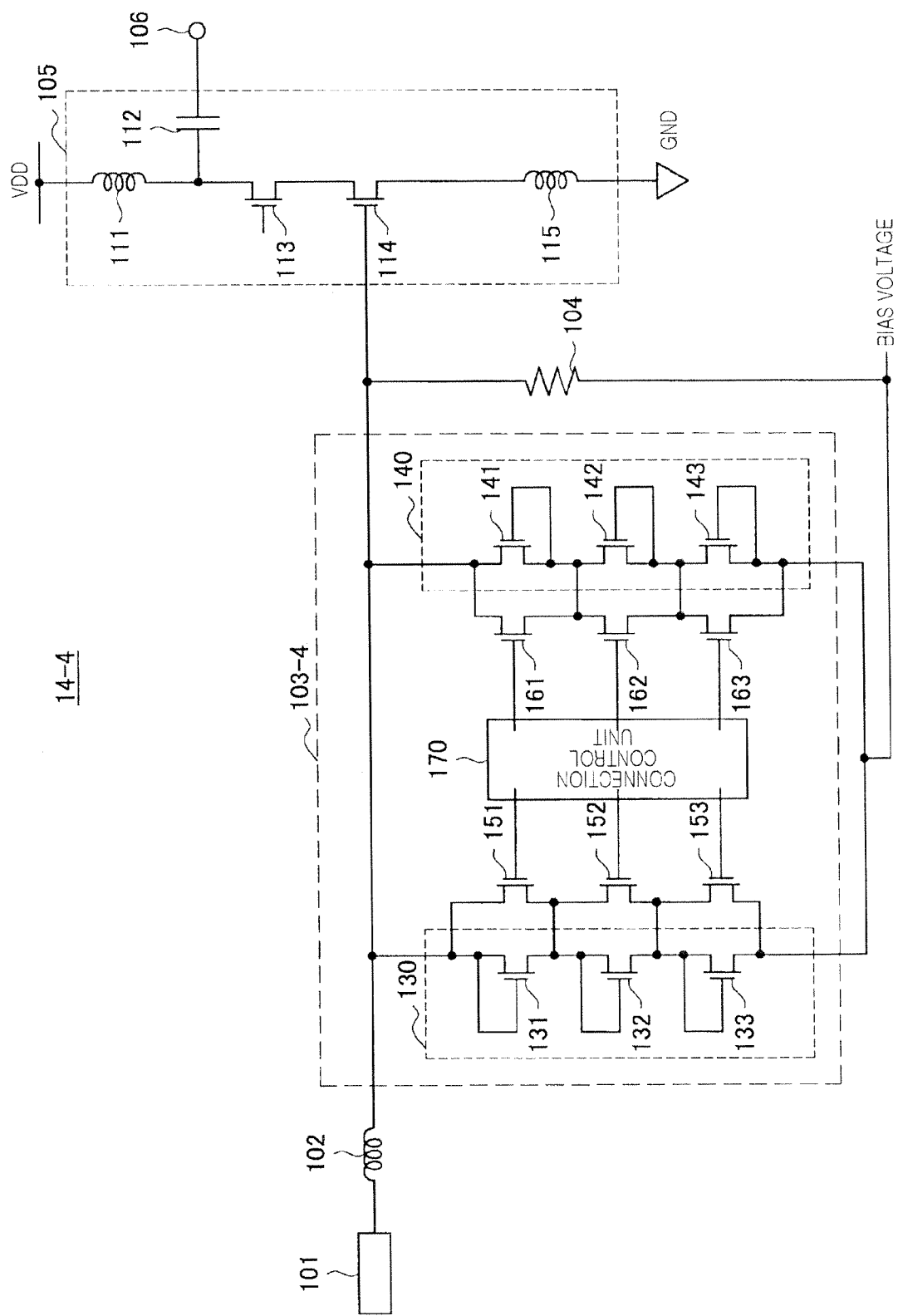
FIG. 9 is a diagram illustrating a circuit configuration of an LNA according to a fourth embodiment of the present invention.

FIG. 9 is a diagram illustrating a circuit configuration of an LNA 14-4 according to a fourth embodiment of the present invention. As shown in FIG. 9, the LNA 14-4 according to the fourth embodiment of the present invention includes the input terminal 101, the inductor 102, a protective circuit 103-4, the resistor element 104, the amplifier circuit 105, and the output terminal 106. Components other than the protective circuit 103-4 are the same as the first embodiment of the present invention and therefore, a detailed description thereof will be omitted herein.

The protective circuit 103-4 is a circuit for preventing a large signal from being input to the amplifier circuit 105 and may be disposed in parallel with the resistor element 104 between the amplifier circuit 105 and the inductor 102.

In detail, the protective circuit 103-4 may include a first MOS transistor group 130, a second MOS transistor group 140 disposed in parallel with the first MOS transistor group 130, switch transistors 151 to 153, switch transistors 161 to 163, and a connection control unit 170.

The first MOS transistor group 130 includes a plurality of MOS transistors 131 to 133 disposed in series, and respective MOS transistors 131 to 133 are diode-connected in the same direction. Meanwhile, FIG. 9 shows an example in which three MOS transistors 131 to 133 configure the first MOS transistor group 130, but the number of MOS transistors configuring the first MOS transistor group 130 is not particularly limited. Further, threshold characteristics of the MOS transistors 131 to 133 may be the same or different.

The second MOS transistor group 140 includes a plurality of MOS transistors 141 to 143 disposed in series, and respective MOS transistors 141 to 143 are diode-connected in a reverse direction with respect to the MOS transistors 131 to 133. Meanwhile, FIG. 9 shows an example in which three MOS transistors 141 to 143 configure the second MOS transistor group 140, but the number of MOS transistors configuring the second MOS transistor group 140 is not particularly limited. Further, threshold characteristics of the MOS transistors 141 to 143 may be the same or different.

The switch transistors 151 to 153 may short-circuit sources and drains of the respective MOS transistors 131 to 133 according to a control performed by the connection control unit 170. For example, when a control voltage is applied to a gate of the switching transistor 151 by the connection control unit 170, the voltage is conducted through the switching transistor 151 and the source and the drain of the MOS transistor 131 are short-circuited.

Similarly, the switch transistors 161 to 163 may short-circuit sources and drains of the respective MOS transistors 141 to 143 according to the control performed by the connection control unit 170. For example, when the control voltage is applied to a gate of the switching transistor 161 by the connection control unit 170, the voltage is conducted through the switching transistor 161 and the source and the drain of the MOS transistor 141 are short-circuited.

The connection control unit 170 controls the short-circuit of the sources and the drains of respective MOS transistors configuring the first MOS transistor group 130 and the second MOS transistor group 140 by applying the control voltage to the gates of the switch transistors 151 to 153 and the switch transistors 161 to 163.

(Operation of LNA According to Fourth Embodiment)

The configuration of the LNA 14-4 according to the fourth embodiment of the present invention is described above. Next, the operation of the LNA 14-4 according to the fourth embodiment of the present invention will be described.

In the fourth embodiment of the present invention, a value obtained by adding a sum of threshold voltages of MOS transistors having sources and drains that are not short-circuited in the first MOS transistor group 130 to the bias voltage may be the upper limit voltage. That is, when it is assumed that the number of MOS transistors having sources and the drains that are not short-circuited is set to be N1 and the threshold voltages Vth of respective MOS transistors are the same, the upper limit voltage is represented by (bias voltage+ N1*Vth).

In addition, a value obtained by subtracting a sum of the threshold voltages of MOS transistors having sources and drains that are not short-circuited in the second MOS transistor group 140 from the bias voltage may be the lower limit voltage. That is, when it is assumed that the number of MOS transistors having sources and drains that are not short-circuited is set to be N2 and the threshold voltages Vth of respective MOS transistors are the same, the lower limit voltage is represented by (bias voltage−N2*Vth).

When a signal greater than the upper limit voltage (bias voltage+N1*Vth) is input, the voltage is conducted through the MOS transistors having sources and drains that are not short-circuited in the first MOS transistor group 130 and therefore, a signal value is limited to the upper limit voltage. Similarly, when a signal lower than the lower limit voltage (bias voltage−N2*Vth) is input to the input terminal 101, the voltage is conducted through the MOS transistors having sources and drains that are not short-circuited in the second MOS transistor group 140 and therefore, the signal value is limited to the lower limit voltage.

Figure 10:
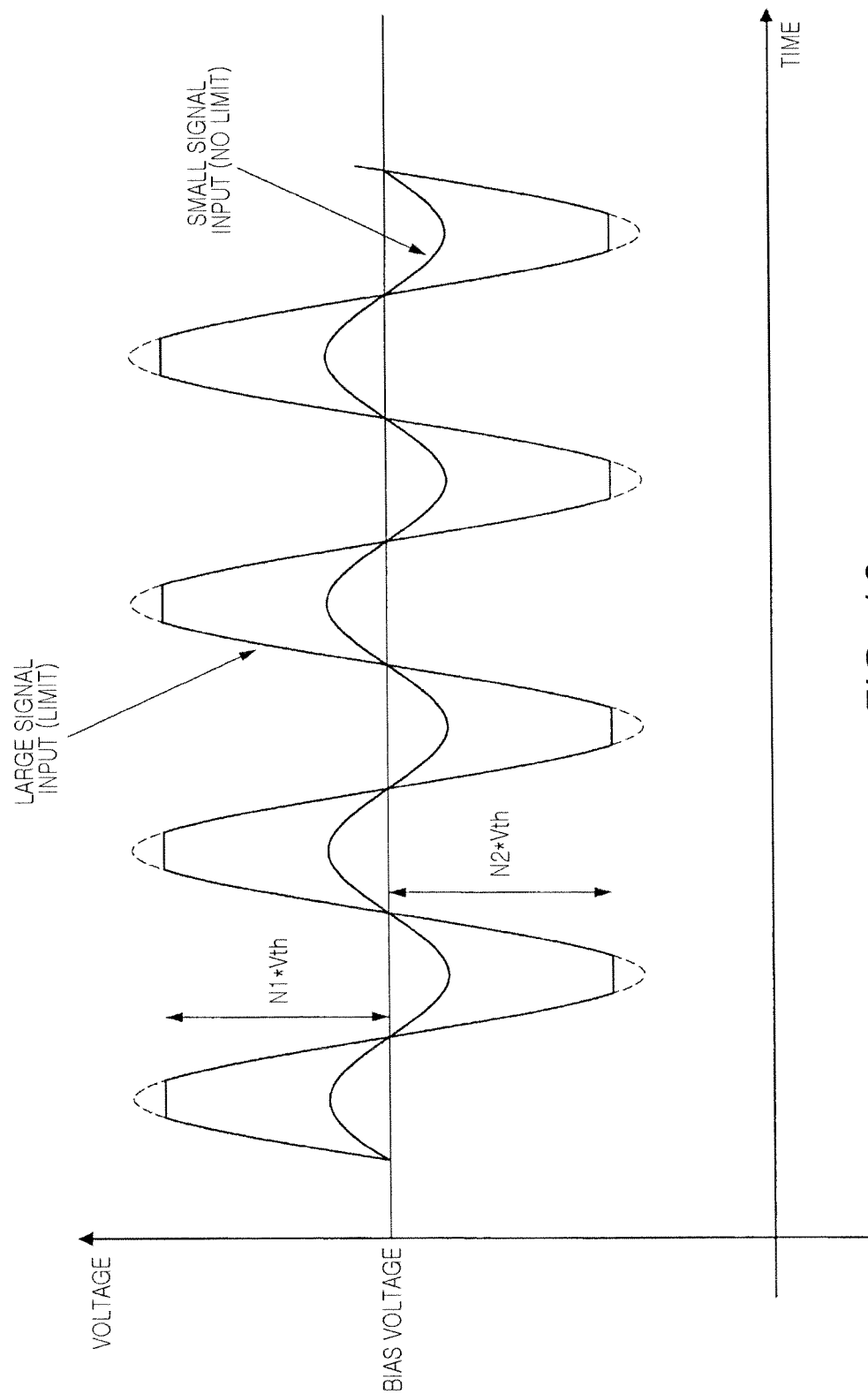
FIG. 10 is a diagram illustrating an operation of the LNA according to the fourth embodiment of the present invention.

For this reason, as shown in FIG. 10, when a signal having a low amplitude is input, the first MOS transistor group 130 and the second MOS transistor group 140 are not operated and therefore, the input signal is input to the amplifier circuit 105 as is. Meanwhile, when a signal having a high amplitude is input, a limit is applied by the upper limit voltage and the lower limit voltage, such that the amplitude of voltage input to the amplifier circuit 105 is limited.

(Effect of Fourth Embodiment)

As described above, according to the fourth embodiment of the present invention, the upper limit voltage and the lower limit voltage may be adjusted by controlling the short-circuit of the sources and the drains of respective MOS transistors and therefore, the input transistor 114 may be appropriately protected from the over-input signal.

In addition, when the first MOS transistor group 130 is formed of MOS transistors having different threshold voltages, it is possible to set various upper limit voltages by a combination of the MOS transistors having sources and drains that are not short-circuited. Similarly, when the second MOS transistor group 140 is formed of MOS transistors having different threshold voltages, it is possible to set various lower limit voltages by a combination of the MOS transistors having sources and drains that are not short-circuited.

6. FIFTH EMBODIMENT

Configuration of LNA According to Fifth Embodiment

Figure 11:
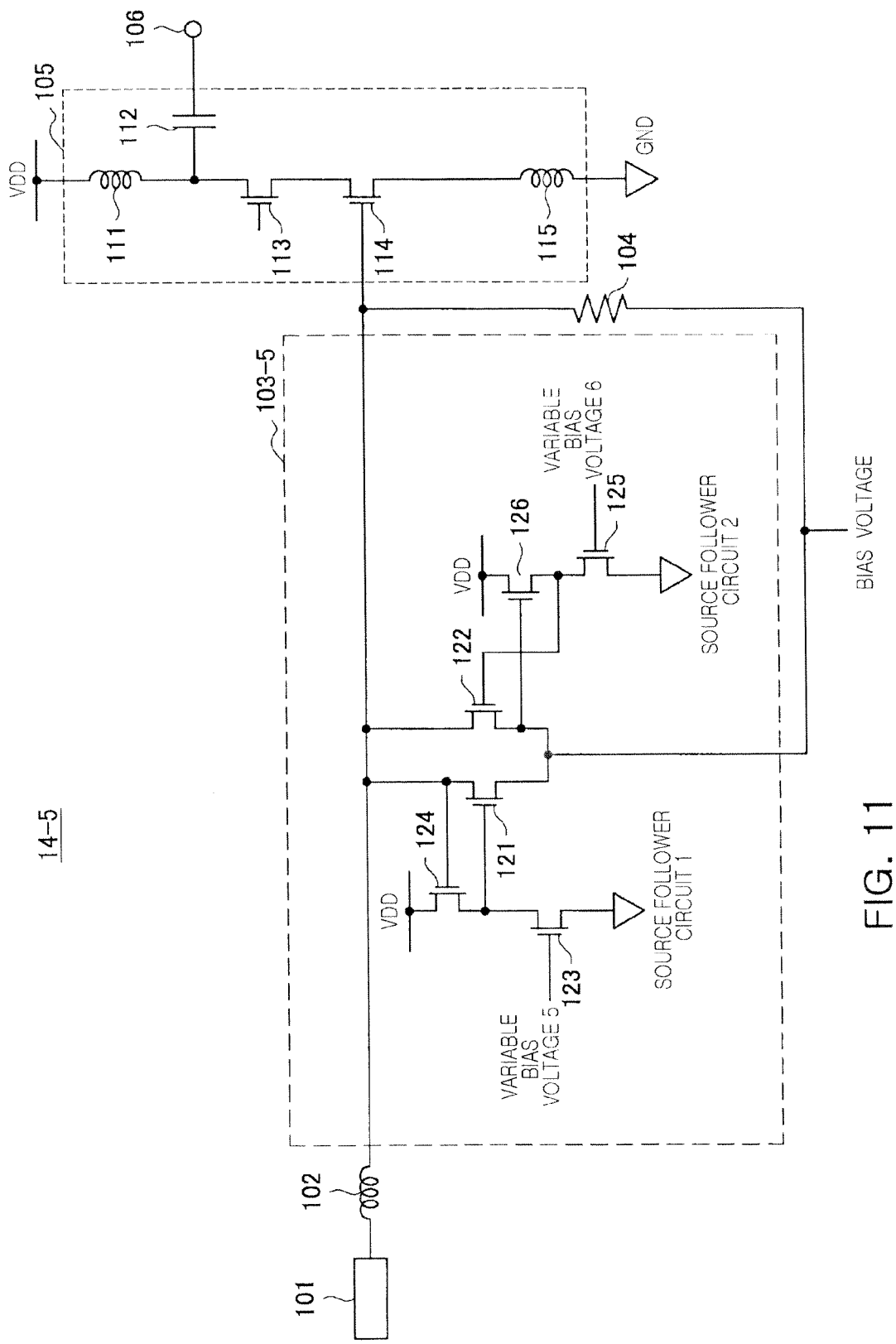
FIG. 11 is a diagram illustrating a circuit configuration of an LNA according to a fifth embodiment of the present invention.

FIG. 11 is a diagram illustrating a circuit configuration of an LNA 14-5 according to a fifth embodiment of the present invention. As shown in FIG. 11, the LNA 14-5 according to the fifth embodiment of the present invention includes the input terminal 101, the inductor 102, a protective circuit 103-5, the resistor element 104, the amplifier circuit 105, and the output terminal 106. Components other than the protective circuit 103-5 are the same as the first embodiment of the present invention and therefore, the detailed description thereof will be omitted herein.

The protective circuit 103-5 is a circuit for preventing a large signal from being input to the amplifier circuit 105 and may be disposed in parallel with the resistor element 104 between the amplifier circuit 105 and the inductor 102. In detail, the protective circuit 103-5 may include the MOS transistor 121, the MOS transistor 122, a source follower circuit 1, and a source follower circuit 2.

The drain of the MOS transistor 121 is connected to the gate of the input transistor 114 and the source thereof is connected to the bias voltage. In addition, the source of the MOS transistor 122 is connected to the gate of the input transistor 114 and the drain thereof is connected to the bias voltage.

The source follower circuit 1 may include a MOS transistor 123 (third transistor) and a MOS transistor 124. The MOS transistor 124 has a gate connected to the drain of the MOS transistor 121, a drain connected to the power supply voltage VDD, and a source connected to the MOS transistor 123. Meanwhile, the MOS transistor 123 has a drain connected to the gate of the MOS transistor 121 and a gate connected to a variable bias voltage 5.

In addition, the source follower circuit 2 may include a MOS transistor 125 (fourth transistor) and a MOS transistor 126. The MOS transistor 126 has a gate connected to the drain of the MOS transistor 122, a drain connected to the power supply voltage VDD, and a source connected to the MOS transistor 125. Meanwhile, the MOS transistor 125 has a drain connected to the gate of the MOS transistor 122 and a gate connected to a variable bias voltage 6. (Operation of LNA According to Fifth Embodiment)

The configuration of the LNA 14-5 according to the fifth embodiment of the present invention is described above. Next, the operation of the LNA 14-5 according to the fifth embodiment of the present invention will be described.

In the fifth embodiment of the present invention, a sum of the bias voltage, the threshold voltage Vth of the MOS transistor 121, and $\Delta V3$ may be the upper limit voltage. Here, $\Delta V3$ is a variation in voltage between input and output voltages generated by the source follower circuit 1 and is adjusted by the variable bias voltage 5. In addition, a value obtained by subtracting the threshold voltage Vth of the MOS transistor 122 and $\Delta V4$ from the bias voltage may be the lower limit voltage. Here, $\Delta V4$ is variation in voltage between input and output voltages generated by the source follower circuit 2 and is adjusted by the variable bias voltage 6.

Figure 12:
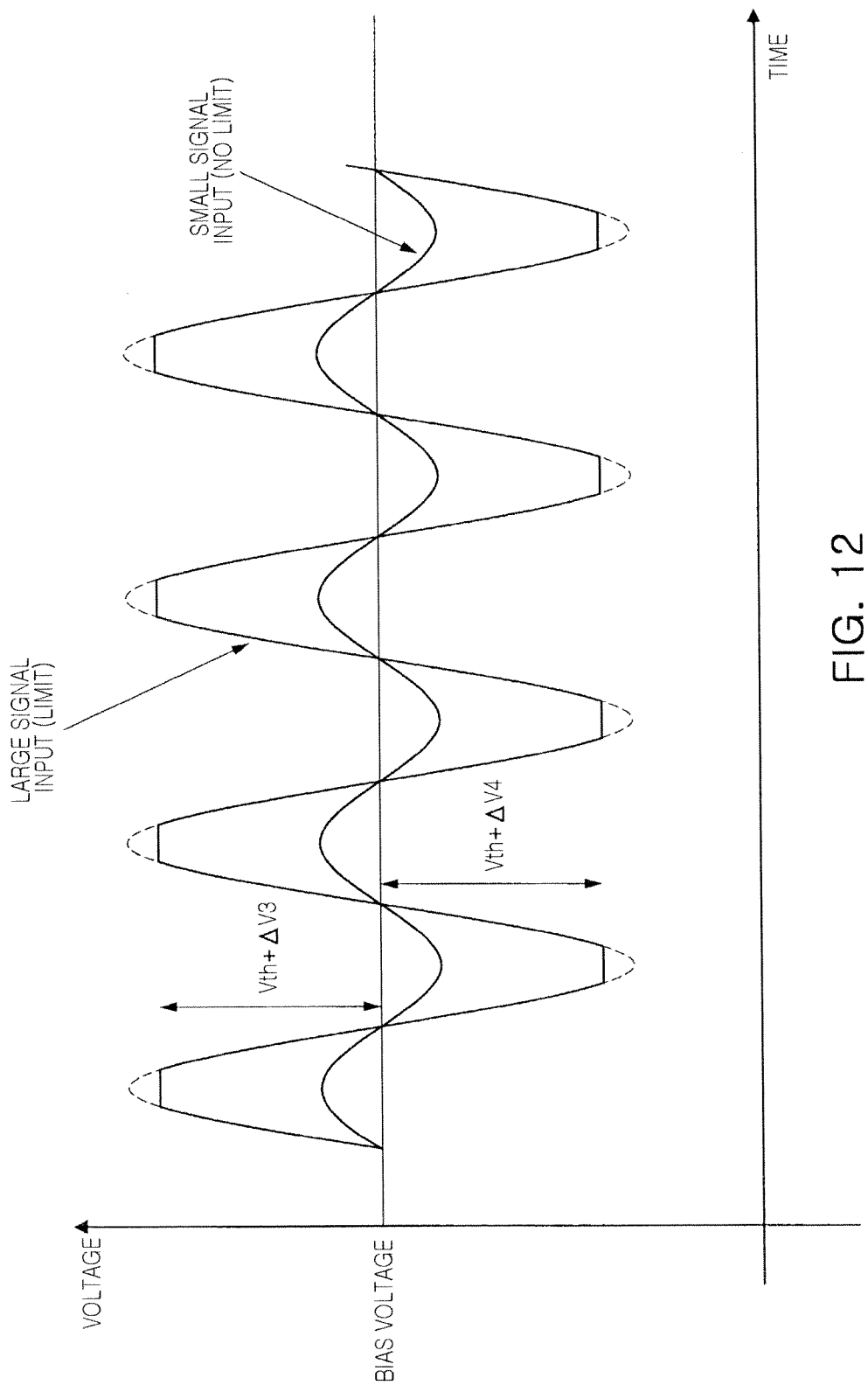
FIG. 12 is a diagram illustrating an operation of the LNA according to the fifth embodiment of the present invention.

For this reason, as shown in FIG. 12, in the case that a signal having a low amplitude is input, the MOS transistors 121 and 122 are not operated and therefore, the input signal is input to the amplifier circuit 105 as is. Meanwhile, in the case that a signal having a high amplitude is input, the limit is applied by the upper limit voltage and the lower limit voltage, such that the amplitude of voltage input to the amplifier circuit 105 is limited.

(Effect of Fifth Embodiment)

As described above, according to the fifth embodiment of the present invention, the upper limit voltage and the lower limit voltage may be adjusted by the variable bias voltage connected to the source follower circuits and therefore, the input transistor 114 may be appropriately protected from the over-input signal.

7. CONCLUSION

As described above, the LNAs 14-1 to 14-5 according to respective embodiments of the present invention may appropriately protect the amplifier circuits from the over-input signal while suppressing the deterioration of the noise figure. In addition, according to the second to fifth embodiments of the present invention, it is possible to more appropriately protect the input transistors 114 of the LNAs 14-1 to 14-5 by adjusting the upper limit voltage and the lower limit voltage that limit the input signals.

As set forth above, according to the embodiments of the present invention, it is possible to limit the over-input signal to be within the range of adjustable upper limit voltage and lower limit voltage while suppressing deterioration of the noise figure.

Meanwhile, the optimal embodiments of the present invention are described in detail with reference to the accompanying drawings, but the present invention is not limited the above embodiments. It is apparent that various variations and modifications can be derived from a person having ordinary skill in the art to which the present invent pertains within the technical scope of the present invention described in claims and therefore, it is understood that these variations and modifications are included in the technical scope of the present invention.

What is claimed is:

1. An amplifier circuit, comprising:
an input transistor;
a resistor element having a first terminal connected to a gate of the input transistor and a second terminal connected to a bias voltage; and
a protective circuit connected to the gate of the input transistor and limiting an input to the gate of the input transistor to be within a range between an upper limit voltage and lower limit voltage adjustable based on the bias voltage,
wherein the protective circuit includes:
a first MOS transistor that is diode-connected, and
a second MOS transistor disposed in parallel with the first MOS transistor and diode-connected in a reverse direction with respect to the first MOS transistor,
wherein a source of the first MOS transistor and a drain of the second MOS transistor are connected to the bias voltage, and
a body terminal of the first MOS transistor and a body terminal of the second MOS transistor are connected to a variable bias voltage.

2. An amplifier circuit, comprising:
an input transistor;
a resistor element having a first terminal connected to a gate of the input transistor and a second terminal connected to a bias voltage; and
a protective circuit connected to the gate of the input transistor and limiting an input to the gate of the input transistor to be within a range between an upper limit voltage and lower limit voltage adjustable based on the bias voltage,
wherein the protective circuit includes:
a first MOS transistor group including a plurality of MOS transistors disposed in series, respective MOS transistors being diode-connected in the same direction, a second MOS transistor group disposed in parallel with the first MOS transistor group and including a plurality of MOS transistors disposed in series, respective MOS transistors being diode-connected in a reverse direction with respect to the respective MOS transistors included in the first MOS transistor group, and a connection control unit controlling a short-circuit of sources and drains of the respective MOS transistors included in the first MOS transistor group and the second MOS transistor group.

* * * * *